United States Patent
Morita et al.

(10) Patent No.: US 7,589,388 B2
(45) Date of Patent: Sep. 15, 2009

(54) SEMICONDUCTOR DEVICE AND METHOD OF MANUFACTURING THE SAME

(75) Inventors: Yuichi Morita, Kanagawa (JP); Takashi Noma, Gunma (JP); Hiroyuki Shinogi, Gunma (JP); Shinzo Ishibe, Gunma (JP); Katsuhiko Kitagawa, Gunma (JP); Noboru Okubo, Saitama (JP); Kazuo Okada, Gunma (JP); Hiroshi Yamada, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 126 days.

(21) Appl. No.: 11/875,438

(22) Filed: Oct. 19, 2007

(65) Prior Publication Data

US 2008/0128914 A1 Jun. 5, 2008

(30) Foreign Application Priority Data

Oct. 23, 2006 (JP) .............................. 2006-287249

(51) Int. Cl.
*H01L 23/48* (2006.01)
*H01L 23/52* (2006.01)
(52) U.S. Cl. ........................ 257/448; 257/433; 257/690; 257/773; 257/779
(58) Field of Classification Search ................. 257/433, 257/678, 690, 773, 779, 448, 457, 459
See application file for complete search history.

(56) References Cited

U.S. PATENT DOCUMENTS

| 6,429,036 B1 * | 8/2002 | Nixon et al. ................. 438/57 |
| 6,781,244 B2 * | 8/2004 | Prabhu ...................... 257/778 |
| 6,972,480 B2 * | 12/2005 | Zilber et al. ............... 257/678 |

FOREIGN PATENT DOCUMENTS

JP 2005-72554 3/2005

* cited by examiner

*Primary Examiner*—David A Zarneke
*Assistant Examiner*—Jenny L Wagner
(74) *Attorney, Agent, or Firm*—Morrison and Foerster LLP

(57) ABSTRACT

The invention is directed to providing a package type semiconductor device with high reliability and smaller size and a method of manufacturing the same. A semiconductor substrate formed with a device element and a pad electrode on its front surface is prepared. The semiconductor substrate is then selectively etched from its back surface to form an opening. A second insulation film is then formed covering the side and back surfaces of the semiconductor substrate. First and second insulation films on the bottom of the opening are then selectively removed to expose a portion of the pad electrode. A wiring layer is then formed along the side surface of the semiconductor substrate, being electrically connected with the exposed pad electrode. An electrode connect layer is then formed covering the wiring layer. A protection layer is then formed covering the back surface of the semiconductor substrate and having an opening in a region for formation of a sidewall electrode. Then, the sidewall electrode is formed in a region exposed by the opening of the protection layer.

4 Claims, 8 Drawing Sheets

SEMICONDUCTOR DEVICE AND METHOD OF MANUFACTURING THE SAME

CROSS-REFERENCE OF THE INVENTION

This application claims priority from Japanese Patent Application No. 2006-287249, the content of which is incorporated herein by reference in its entirety.

BACKGROUND OF THE INVENTION

1. Field of the Invention

The invention relates to a semiconductor device, particularly, a package type semiconductor device and a method of manufacturing the same.

2. Description of the Related Art

A CSP (chip size package) has received attention in recent years as a new packaging technology. The CSP is a small package having about the same outside dimensions as those of a semiconductor die packaged in it.

A BGA (ball grid array) type semiconductor device has been known as a type of the CSP. The BGA type semiconductor device has a plurality of ball-shaped conductive terminals electrically connected with pad electrodes provided on a semiconductor substrate.

When the BGA type semiconductor device is mounted on electronic equipment, the semiconductor die is electrically connected to an external circuit on a printed board by bonding the conductive terminals to wiring patterns on the printed board.

Such a BGA type semiconductor device has advantages in providing a large number of conductive terminals and in reducing a size over the other CSP type semiconductor devices such as an SOP (small outline package) and a QFP (quad flat Package), which have lead pins protruding from their sides. Therefore, the BGA type semiconductor device has a wide field of application.

FIG. 14 is a schematic cross-sectional view of a conventional BGA type semiconductor device 110. A device element 101 such as a CCD (charge coupled device) image sensor or a CMOS image sensor is formed on the front surface of a semiconductor substrate 100 made of silicon (Si) or the like, and pad electrodes 102 are further formed with a first insulation film 103 interposed therebetween. A glass substrate 104, for example, is further attached on the front surface of the semiconductor substrate 100 with an adhesive layer 105 made of epoxy resin or the like interposed therebetween. Furthermore, a second insulation film 106 made of a silicon oxide film or a silicon nitride film is formed on the side and back surfaces of the semiconductor substrate 100.

Furthermore, wiring layers 107 electrically connected with the pad electrodes 102 are formed on the second insulation film 106. The wiring layers 107 are formed on the side surface and the back surface of the semiconductor substrate 100. A protection layer 108 made of a solder resist or the like is formed covering the second insulation film 106 and the wiring layer 107. Openings are formed in predetermined regions of the protection layer 108 on the wiring layers 107, and ball-shaped conductive terminals 109 are formed being electrically connected with the wiring layers 107 through these openings. The relevant technology is disclosed in Japanese Patent Application Publication No. 2005-072554.

There is a demand for a thinner and smaller device as a whole which includes the above-described package type semiconductor device.

The above-described conventional semiconductor device 110 has a problem that the wiring layer 107 is corroded by a substance causing corrosion such as water, chemicals, metal ion or the like which infiltrates therein in a manufacturing process or in actual use.

SUMMARY OF THE INVENTION

The invention is directed to providing a package type semiconductor device with high reliability and smaller size and a method of manufacturing the same.

The invention is to solve the above problem and the main feature is as follows. The invention provides a semiconductor device including: a semiconductor substrate formed with a device element on its front surface; a pad electrode electrically connected with the device element; an insulation film covering a side surface and a back surface of the semiconductor substrate; a wiring layer electrically connected with the pad electrode and formed along the side surface of the semiconductor substrate; a sidewall electrode formed along the side surface of the semiconductor substrate, being exposed to outside from the side surface of the semiconductor substrate and electrically connected with the pad electrode through the wiring layer; and a protection layer surrounding the sidewall electrode, covering the back surface of the semiconductor substrate, and having an opening in a region overlapping the sidewall electrode.

The invention also provides a method of manufacturing a semiconductor device including: providing a semiconductor substrate formed with a device element and a pad electrode electrically connected with the device element on its front surface; removing a portion of the semiconductor substrate from a back surface of the semiconductor substrate to expose at least a portion of the pad electrode; forming a wiring layer electrically connected with the exposed pad electrode on a side surface of the semiconductor substrate with an insulation film being interposed therebetween; forming a protection layer covering the back surface of the semiconductor substrate and having an opening in a region for formation of a sidewall electrode; and forming the sidewall electrode along the side surface of the semiconductor substrate in a region of the opening of the protection layer, the sidewall electrode being exposed to outside from the side surface of the semiconductor substrate and electrically connected with the pad electrode through the wiring layer.

DETAILED DESCRIPTION OF THE INVENTION

An embodiment of the invention will be described referring to figures. FIGS. 1 to 10 are cross-sectional views or plan views showing the of manufacturing of the device of the embodiment in the order of the process steps. A manufacturing process described below is performed using a wafer-shaped semiconductor substrate and a number of semiconductor devices are formed in a matrix configuration along predetermined dicing lines as boundaries, although the description is given on a process of forming one of these semiconductor devices for convenience.

Figure 1:
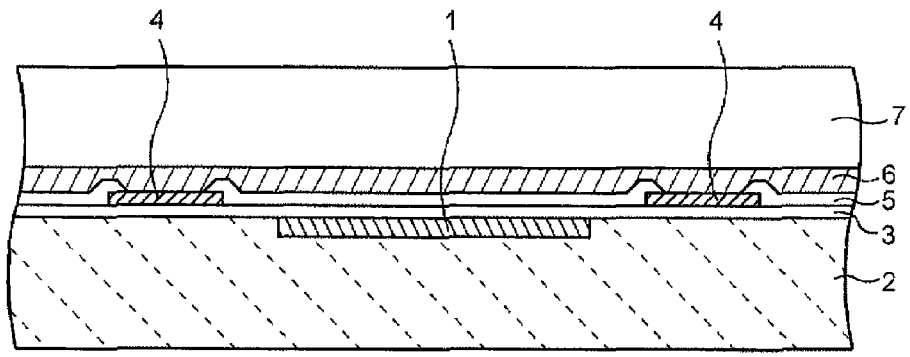
FIGS. 1, 2, 4 to 9, 11 and 12 are cross-sectional views for explaining a semiconductor device and a method of manufacturing the same of an embodiment of the invention.

First, as shown in FIG. 1, a semiconductor substrate 2 made of silicon (Si) or the like formed with a device element 1 (e.g. a light receiving element such as CCD, an infrared ray sensor or a CMOS sensor, a light emissive element, or the other semiconductor element) on its front surface is prepared. The semiconductor substrate 2 is about 300 to 700 μm in thickness, for example. A first insulation film 3 (e.g. a silicon oxide film formed by a thermal oxidation method, a CVD method or the like) is then formed on the front surface of the semiconductor substrate 2 to have a thickness of 2 μm, for example.

Then, a metal layer made of aluminum (Al), an aluminum alloy, copper (Cu) or the like is formed by a sputtering method, a plating method or the other film deposition method. This metal layer is then selectively etched using a resist layer (not shown) as a mask to form pad electrodes 4 having a thickness of, for example, 1 μm on the first insulation film 3. The pad electrode 4 is an electrode for external connection, which is electrically connected with the device element 1 or the other peripheral element through a wiring (not shown). Although the pad electrodes 4 are disposed on the both sides of the device element 1 in FIG. 1, the position thereof is not limited to this and these may be disposed above the device element 1.

Then, a passivation film 5 (e.g. a silicon nitride film formed by a CVD method) is formed on the front surface of the semiconductor substrate 2, partially covering the pad electrodes 4 or entirely covering the pad electrodes 4. In FIG. 1, the passivation film 5 partially covers the pad electrodes 4.

Then, a supporting body 7 is attached to the front surface of the semiconductor substrate 2 including on the pad electrodes 4 with an adhesive layer 6 made of an epoxy resin, polyimide (e.g. photosensitive polyimide), resist, acrylic or the like being interposed therebetween.

The supporting body 7 may be a film-shaped protection tape or a rigid substrate made of glass, quartz, ceramic, metal or the like, or may be made of resin, for example. The supporting body 7 has a function of supporting the semiconductor substrate 2 and protecting the surface of the element. When the device element 1 is a light receiving element or a light emissive element, the supporting body 7 is made of a transparent or semitransparent material and has light transmitting property.

Then, back-grinding is performed to the back surface of the semiconductor substrate 2 using a back surface grinder to reduce the thickness of the semiconductor substrate 2 to a predetermined thickness (e.g. about 50 μm). This grinding process may be replaced by an etching process or the combination of the grinder and the etching process. There is also a case where the grinding process is not necessary depending on the application or specification of an end-product and the initial thickness of the provided semiconductor substrate 2.

Figure 2:
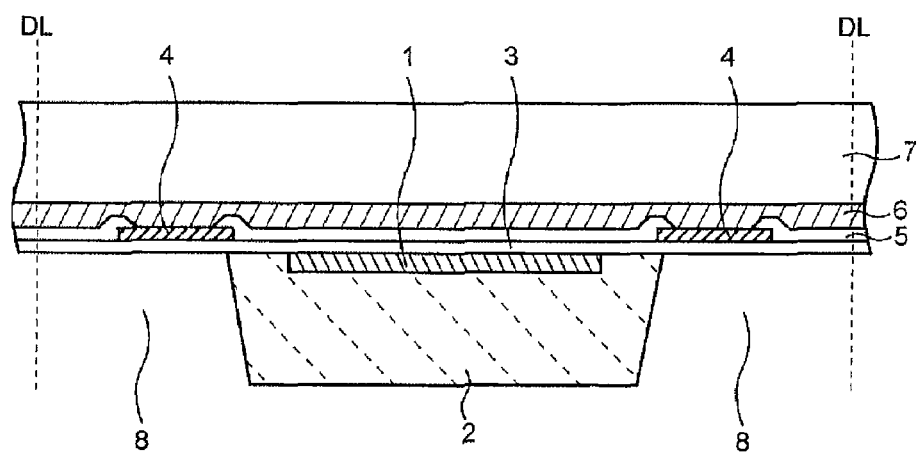

Then, as shown in FIG. 2, the semiconductor substrate 2 is selectively etched only in regions corresponding to the pad electrodes 4 from the back surface of the semiconductor substrate 2 to partially expose the first insulation film 3. Hereafter, this exposed portion is referred to as an opening 8.

Figure 3A:
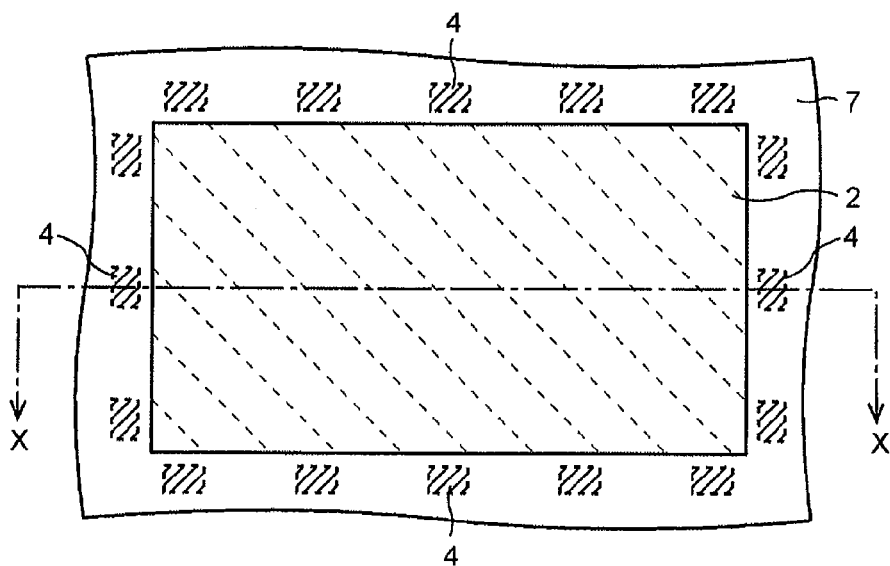
FIGS. 3A, 3B and 10 are plan views for explaining the semiconductor device and the method of manufacturing the same of the embodiment of the invention.
Figure 3B:
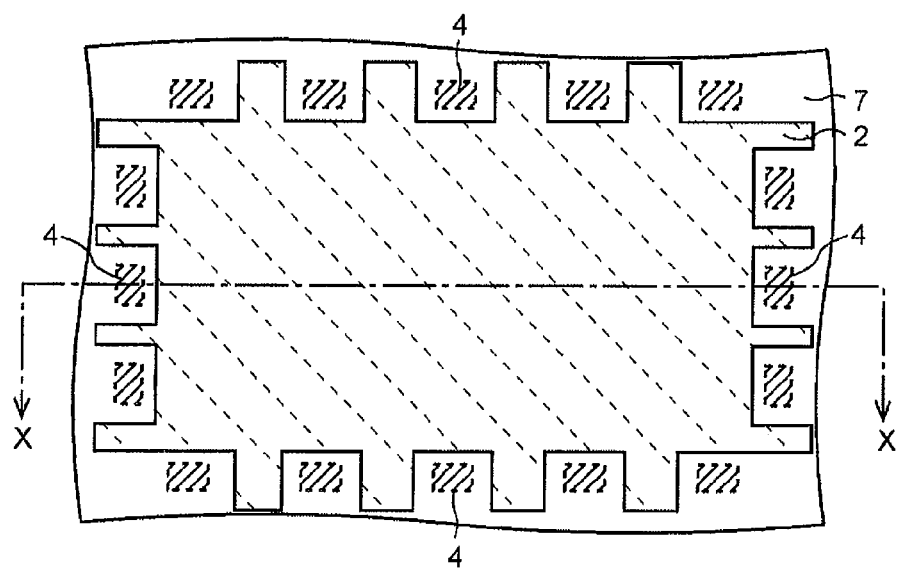

This selective etching of the semiconductor substrate 2 will be described referring to FIGS. 3A and 3B. FIGS. 3A and 3B are schematic plan views on the lower side (on the semiconductor substrate 2 side), and FIG. 2 corresponds to a cross-sectional view along line X-X of FIGS. 3A and 3B.

As shown in FIG. 3A, the semiconductor substrate 2 may be etched into an almost rectangular shape smaller than the supporting body 7. Alternatively, as shown in FIG. 3B, the semiconductor substrate 2 may be etched only in a region formed with the pad electrodes 4 so as to have an uneven periphery. The latter provides the larger overlapping area between the semiconductor substrate 2 and the supporting body 7 and the semiconductor substrate 2 remains near the periphery of the supporting body 7. Therefore, the latter structure is preferable for enhancing the support strength of the supporting body 7 for the semiconductor substrate 2. Furthermore, since the latter structure prevents the supporting body 7 from warping due to the difference in coefficient of thermal expansion between the semiconductor substrate 2 and the supporting body 7, cracking or separation in the semiconductor device is prevented. It is noted that the semiconductor substrate 2 may be designed into the other plane shape than the shape shown in FIGS. 3A and 3B.

Furthermore, although the sidewall of the semiconductor substrate 2 is etched obliquely so that the width of the semiconductor substrate 2 is wider on the front surface side in this embodiment, the semiconductor substrate 2 may be etched to have the constant width and form the sidewall perpendicular to the main surface of the supporting body 7.

Figure 4:
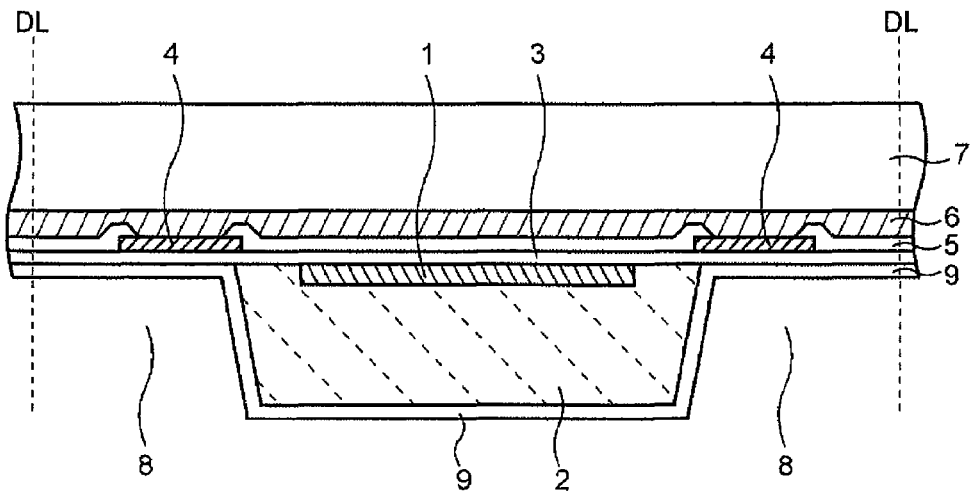

Then, as shown in FIG. 4, a second insulation film 9 is formed in the opening 8 and on the back surface of the semiconductor substrate 2. This second insulation film 9 is an insulation film such as a silicon oxide film or a silicon nitride film formed by, for example, a plasma CVD method.

Figure 5:
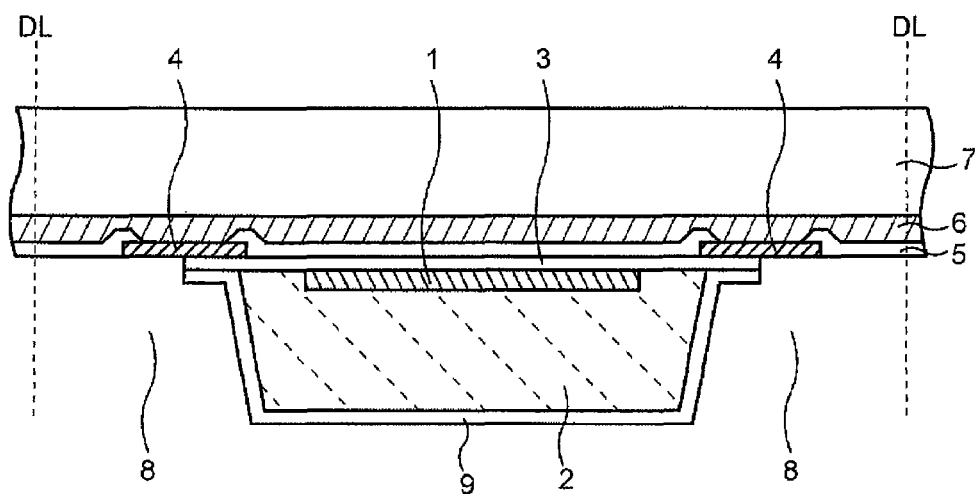

Then, as shown in FIG. 5, the first insulation film 3 and the second insulation film 9 are selectively etched using a resist layer (not shown) as a mask. By this etching, the first insulation film 3 and the second insulation film 9 formed in regions from a portion of the pad electrodes 4 to the dicing lines DL are removed to expose at least a portion of each of the pad electrodes 4 on the bottom of the opening 8.

Figure 6:
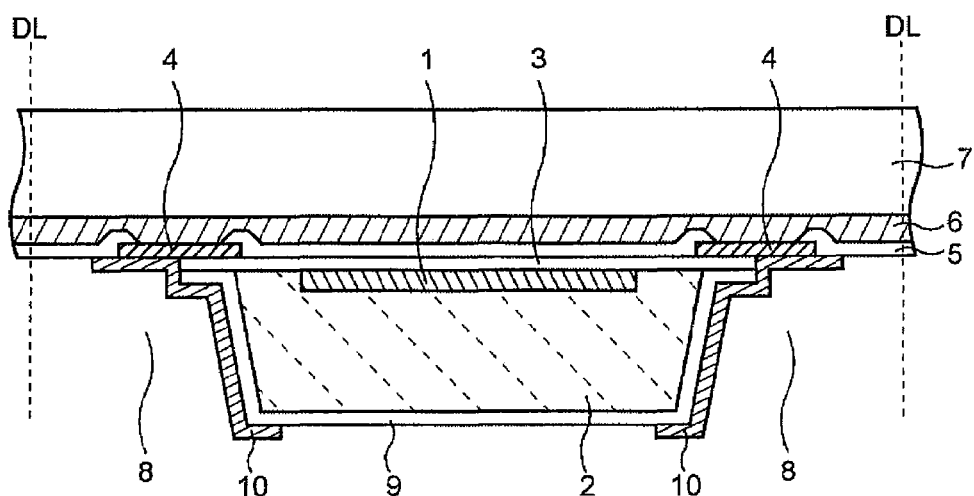

Then, a conductive layer made of aluminum (Al), copper (Cu) or the like for wiring layers 10 are formed by a sputtering method, a plating method or the other film deposition method to have a thickness of, for example, 1 μm. Then, this conductive layer is selectively etched using a resist layer (not shown) as a mask. By this etching, the conductive layer forms the wiring layers 10 along the side surface of the semiconductor substrate 2 with the second insulation film 9 being interposed therebetween, as shown in FIG. 6. Each of the wiring layers 10 is connected with at least a portion of each of the pad electrodes 4 and extends onto a portion of the back surface of the semiconductor substrate 2.

Figure 7:
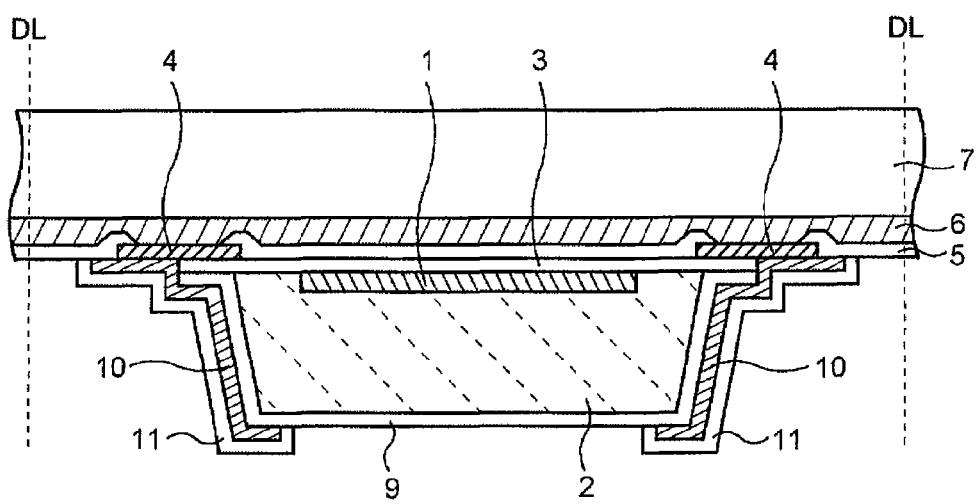

Then, as shown in FIG. 7, electrode connect layers 11 are formed covering the wiring layers 10. The electrode connect layer 11 is formed because the wiring layer 10 made of aluminum or the like and a sidewall electrode 13 made of solder or the like that will be described below are hardly attached together and for the purpose of preventing the material of the sidewall electrode 13 from entering the pad electrode 4. Therefore, it is preferable to form the electrode connect layers 11 so as to entirely cover the wiring layers 10 as shown in FIG. 7. The electrode connect layer 11 is a layer formed by layering, for example, a nickel (Ni) layer and a gold (Au) layer in this order, which is formed by a lift-off method where these metals are sequentially sputtered using a resist layer as a mask and then the resist layer is removed, or a plating method.

The material of the electrode connect layer 11 may be changed depending on the material of the wiring layer 10 or the sidewall electrode 13 as appropriate. In detail, the electrode connect layer 11 may be formed of a titanium (Ti) layer, a tungsten (W) layer, a copper (Cu) layer, a tin (Sn) layer, a vanadium (V) layer, a nickel vanadium (NiV) layer, a molybdenum (Mo) layer, a tantalum (Ta) layer or the like, instead of the nickel layer and the gold layer. The material thereof is not particularly limited as long as it electrically connects the wiring layer 10 and the sidewall electrode 13 therebetween and has a function of protecting the wiring layer 10, and the electrode connect layer 11 may be a single or multilayer of the above layers. As an example of the layered structure, there are a nickel layer /a gold layer, a titanium layer/a nickel layer/a copper layer, a titanium layer /a nickel layer/a gold layer, a titanium layer /a nickel vanadium layer/a copper layer, or the like.

Figure 8:
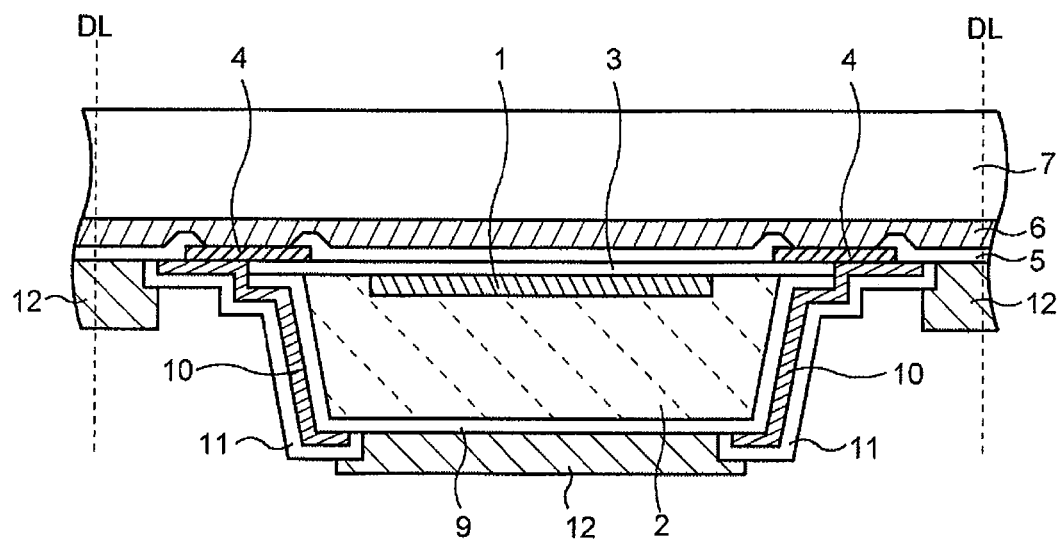

Then, as shown in FIG. 8, a protection layer 12 having a thickness of, for example, 10 μm is formed having openings in regions for formation of the sidewall electrodes 13 that will be described below. The protection layer 12 is formed as follows, for example. First, an organic material such as polyimide type resin, a solder resist or the like is applied to the whole surface by a coating method and a heat treatment (pre-bake) is performed thereto. Then, exposure and development are performed to the applied organic material to form openings exposing the front surfaces of the electrode connect layers 11, and then a heat treatment (post-bake) is performed thereto, thereby providing the protection layer 12 having openings in regions for formation of the sidewall electrodes 13.

Figure 9:
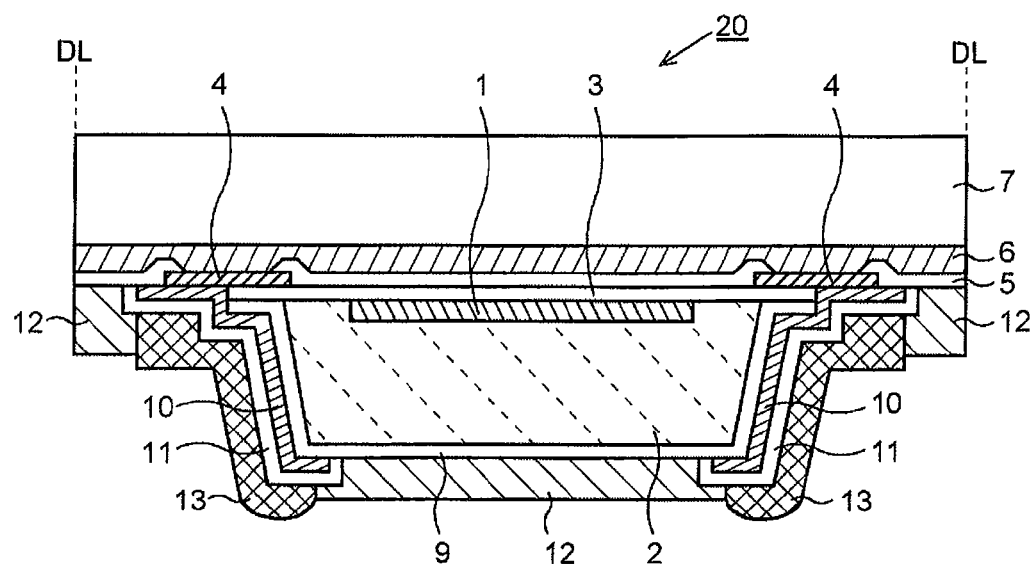

Then, a conductive material (e.g. solder) is screen-printed on the electrode connect layers 11 exposed in the openings of the protection layer 12, and this conductive material is reflowed by a heat treatment. In this manner, as shown in FIG. 9, the sidewall electrodes 13 electrically connected with the pad electrodes 4 through the wiring layers 10 and the electrode connect layers 11 are formed along the side surface of the semiconductor substrate 2. The sidewall electrodes 13 in this embodiment are located almost under the regions where the pad electrodes 4 are formed, respectively, and formed along the periphery of the supporting body 7. The sidewall electrodes 13 are exposed to outside from the side surface of the semiconductor substrate 2.

The method of forming the sidewall electrodes 13 is not limited to the above, and it may be formed by an electrolytic plating method using the electrode connect layers 11 as a plating electrode or a so-called dispensing (coating) method where a solder or the like is applied to a predetermined region with a dispenser. The sidewall electrodes 13 may be formed of gold, copper or nickel, and the material thereof is not particularly limited.

Then, the wafer is cut along the dicing lines DL and divided into individual semiconductor devices 20. There are a dicing method, an etching method, a laser cutting method and the like as a method of dividing the wafer into individual semiconductor devices 20. The supporting body 7 may be left attached to the semiconductor substrate 2, but it may be removed from the semiconductor substrate 2 before or after the dicing process.

Figure 10:
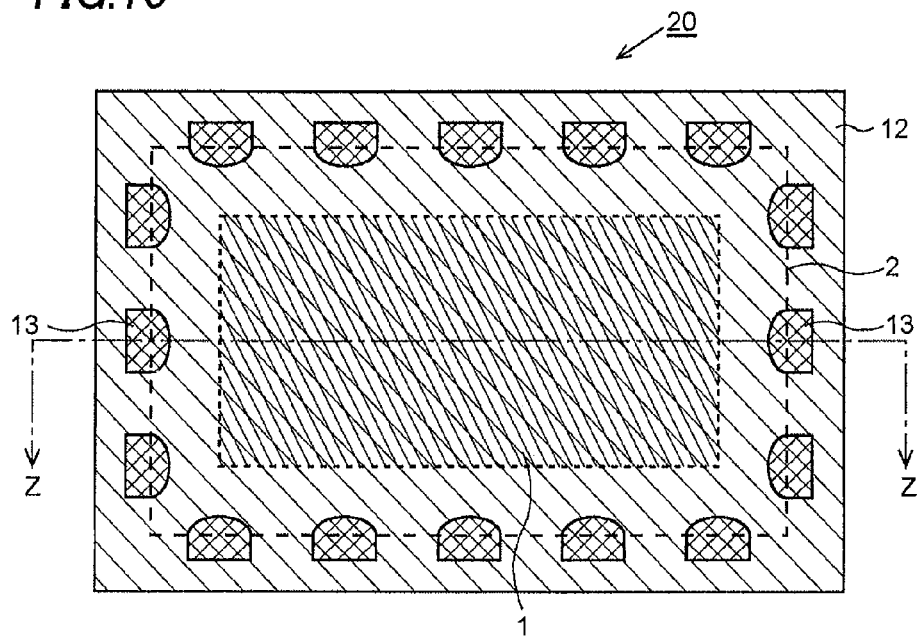

FIG. 10 is a schematic plan view of the semiconductor device 20 on its back side (the side where the supporting body 7 is not formed). As shown, the semiconductor device 20 has the plurality of sidewall electrodes 13 along its periphery. The semiconductor device 20 in FIG. 9 corresponds to a cross-sectional view along line Z-Z of FIG. 10.

Figure 14:
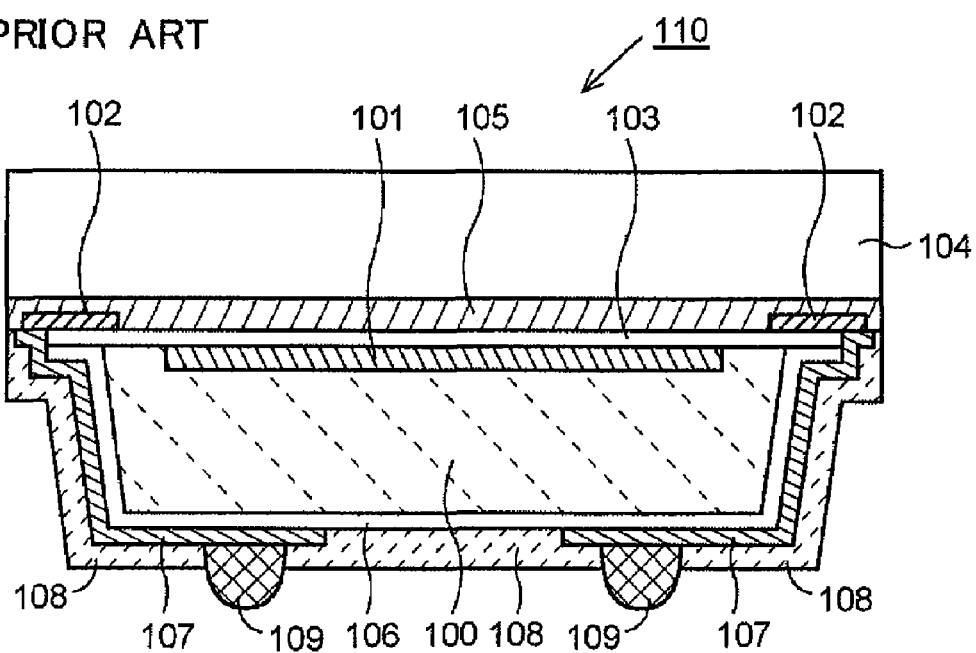
FIG. 14 is a cross-sectional view for explaining a conventional semiconductor device.

In this embodiment, unlike the conventional structure (see FIG. 14), ball-shaped conductive terminals are not formed on the back surface of the semiconductor substrate, and the sidewall electrodes 13 are formed along the side surface of the semiconductor substrate. This realizes a thinner semiconductor device than conventional.

Furthermore, the wiring layers 10 are formed along the side surface of the semiconductor substrate 2, and covered by the sidewall electrodes 13. Therefore, the sidewall electrodes 13 prevent infiltration of a corrosive substance into the wiring layers 10, and the corrosion of the wiring layers 10 is prevented more than conventional. Furthermore, the electrode connect layers 11 covering the wiring layers 10 also prevent infiltration of a corrosive substance into the wiring layers 10.

When a wiring material (e.g. aluminum) is formed wide on the back surface of the semiconductor substrate 2, light having a specified wavelength (e.g. an infrared ray) entering from the supporting body 7 may be transmitted through the semiconductor substrate 2 and reflected by the wiring material toward the device element 1. When the device element 1 is a light receiving element, this may cause a problem of reflecting the wiring pattern in an output image.

This embodiment prevents this problem. In the conventional structure, in order to form the ball-shaped conductive terminal 109, it is necessary to extend a wiring layer onto the back surface of the semiconductor substrate by a certain length. On the other hand, this embodiment realizes reduction of the length of the wiring layer 10 on the back surface of the semiconductor substrate 2 compared with the conventional structure by the formation of the sidewall electrodes 13.

Furthermore, preventing the problem of reflecting the wiring pattern in an image realizes increase of the plane area of the device element 1 relative to the semiconductor substrate 2. This realizes the wider light receiving or light emissive region, for example, and provides an advantage of manufacturing a semiconductor device with high quality and smaller size.

Then, an example of the semiconductor device 20 mounted on a circuit board (a module substrate) will be described. The following description is given on an example where the device element 1 is used as a light receiving element such as a CCD or CMOS image sensor and the semiconductor device 20 is used as an imaging device of a camera module.

Figure 11:
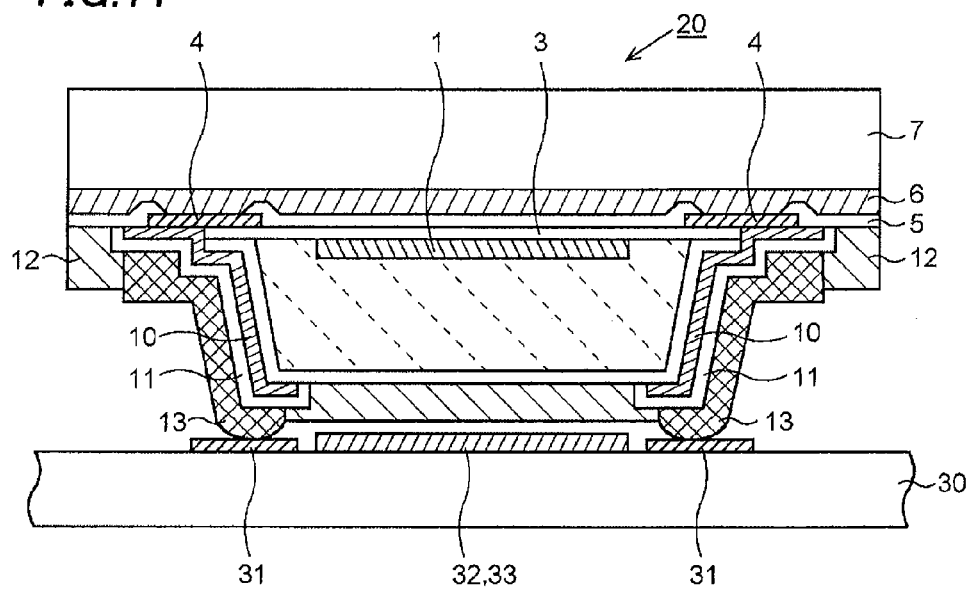

For example, as shown in FIG. 11, the sidewall electrodes 13 are directly connected to external electrodes 31 of a circuit board 30 such as a printed substrate. Although not shown, there is also a case where the sidewall electrode 13 and an electrode of the other device are indirectly connected through a conductive material such as a bonding wire or a wiring.

As shown in FIG. 11, a layer absorbing light having a specified wavelength (e.g. an infrared ray absorption layer 32) may be formed in a position of the circuit board 30 which overlaps the light receiving region of the device element 1 and does not overlap the sidewall electrodes 13. The infrared ray absorption layer 32 is made of, for example, a resin layer added with an infrared ray absorption material such as a black pigment, for example. With this structure, an infrared ray transmitted through the semiconductor substrate 2 from the supporting body 7 is prevented from being reflected by the surface of the circuit board 30 toward the device element 1.

Alternatively, instead of the infrared ray absorption layer 32 in FIG. 11, a reflection layer 33 may be formed in that position. The reflection layer 33 is a layer which does not transmit light having a specified wavelength (e.g. an infrared ray) entering from the supporting body 7 toward the back side of the semiconductor substrate 2 therethrough and reflects the light toward the device element 1. The reflection layer 33 contains a metal material such as aluminum or copper, for example, and is formed by a film deposition method such as a CVD method or a sputtering method. With this structure, light entering from the supporting body 7 and reaching the reflection layer 33 through the semiconductor substrate 2 is reflected toward the device element 1. This increases light intensity for the device element 1 and enhances the contrast of an output image.

Figure 12:
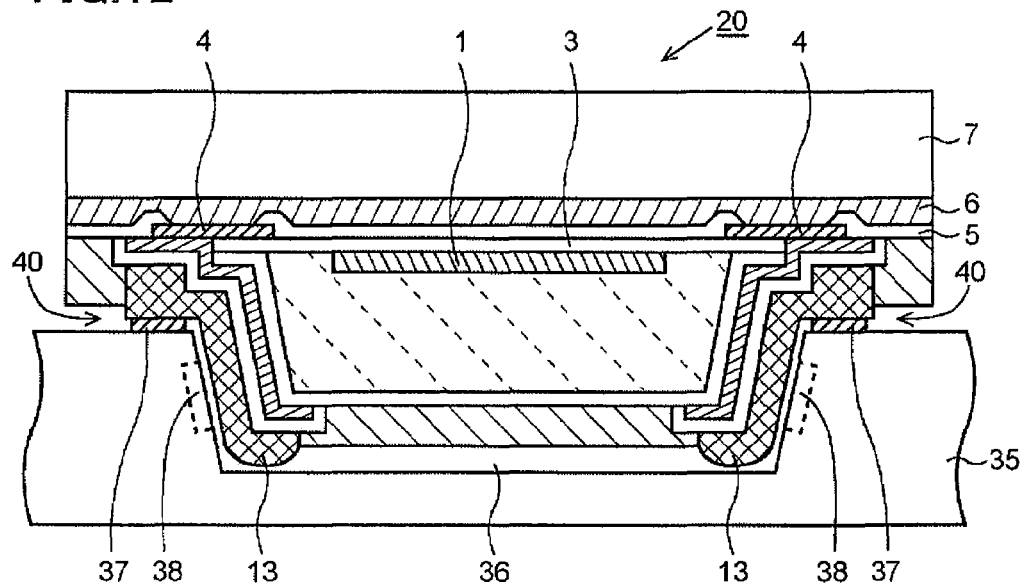

Alternatively, the semiconductor device 20 may be mounted on a circuit board as shown in FIG. 12. As shown in FIG. 12, a concave portion 36 is formed in the circuit board 35, and the semiconductor device 20 is mounted thereon with a convex portion (of the semiconductor device 20 on the semiconductor substrate 2 side) being embedded in this concave portion 36. The formation of the concave portion 36 is performed by, for example, etching with laser irradiation, cutting with a drill, or the like. External electrodes 37 are formed in the higher position of the front surface of the circuit board 35, which is formed by the step due to the concave portion 33.

A portion of each of the sidewall electrodes 13 which is adjacent to the supporting body 7 and each of the external electrodes 37 are directly connected. Alternatively, external electrodes 38 may be provided along the side surface of the concave portion 36 and the external electrodes 38 and the sidewall electrodes 13 may be directly connected, respectively. In this manner, the 30 semiconductor device of this embodiment has various ways of its mounting on a circuit board and has enhanced flexibility in designing.

Furthermore, in the conventional structure (see FIG. 14), it is difficult to add a conductive material in a portion formed with the conductive terminal 109 after a semiconductor device 110 is mounted on a circuit board. That is, in a case where the semiconductor device is completed with the conductive material which forms the conductive terminal 109 being short and then mounted on the circuit board as it is, a problem of a connection error occurs and this problem is difficult to solve. On the other hand, in this embodiment, the sidewall electrodes 13 are formed along the side surface of the semiconductor substrate 2. Therefore, the problem of the connection error is solved after the device is mounted on the circuit board, by adding the material of the sidewall electrode 13 (e.g. solder) from between the semiconductor device 20 and the circuit board 35 as shown in an arrow 40 in FIG. 12, for example.

Figure 13:
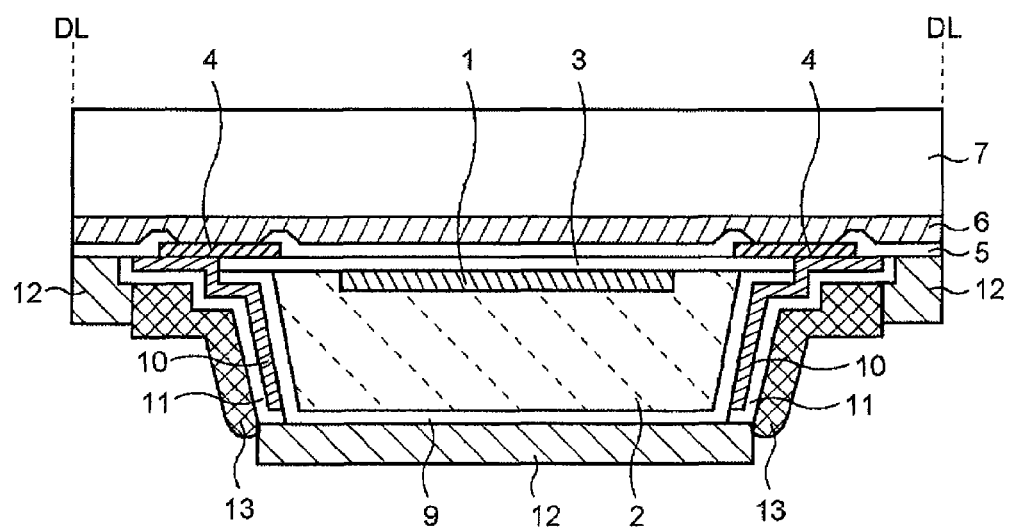
FIG. 13 is a cross-sectional view for explaining a semiconductor device and a method of manufacturing the same of another embodiment of the invention.

The invention is not limited to the above embodiment and the modification of the design is possible within the scope of the invention. For example, as shown in FIG. 13, in the process of forming the wiring layers 10, the wiring layers 10 may be formed so as not to extend onto a portion of the back surface of the semiconductor substrate 2. Furthermore, as shown in FIG. 13, the electrode connect layers 11 may be also formed so as not to extend onto a portion of the back surface of the semiconductor substrate 2. In this manner, the sidewall electrodes 13 are prevented from protruding from the back side of the semiconductor substrate 2 by patterning the wiring layers 10 or the electrode connect layers 11, thereby achieving a much thinner semiconductor device. It is preferable to use a dispensing method for forming the sidewall electrodes 13 in this case.

Alternatively, as another embodiment where the sidewall electrode 13 is prevented from protruding from the back side of the semiconductor substrate 2, after the wiring layers 10 and the electrode connect layers 11 are formed extending onto a portion of the back surface of the semiconductor substrate 2 as shown in FIG. 7, the protection layer 12 may be formed covering the electrode connect layers 11 and the back surface of the semiconductor substrate 2 as shown in FIG. 13, and then the sidewall electrodes 13 may be formed on the electrode connect layers 11 which is not covered by the protection layer 12.

In the embodiments, unlike the conventional device, the ball-shaped conductive terminals are not formed on the back surface of the semiconductor substrate, and the sidewall electrodes are formed along the side surface of the semiconductor substrate. Therefore, the semiconductor device is formed thinner than conventional. Furthermore, the wiring layers are formed along the side surface of the semiconductor substrate, and the sidewall electrodes are further formed thereon along the side surface of the semiconductor substrate. Therefore, the sidewall electrodes prevent a corrosive substance from infiltrating from outside and prevents corrosion of the wiring layer compared with the conventional device.

What is claimed is:

1. A semiconductor device comprising:
    a semiconductor substrate comprising a front surface, a back surface and a side surface;
    a device element formed on the front surface;
    a pad electrode disposed on the front surface and electrically connected to the device element;
    an insulation film covering the side surface and the back surface;
    a wiring layer disposed on the side surface and electrically connected to the pad electrode;
    a sidewall electrode disposed on the side surface so as to be electrically connected to the pad electrode through the wiring layer; and
    a protection layer disposed on the back surface,
    wherein the sidewall electrode is exposed along the side surface and accommodated in an opening formed in the protection layer.

2. The semiconductor device of claim 1, further comprising an electrode connect layer disposed between the sidewall electrode and the wiring layer, the electrode connect layer covering the wiring layer and electrically connecting the sidewall electrode and the wiring layer.

3. The semiconductor device of claim 1, further comprising a supporting body disposed on the front surface.

4. The semiconductor device of claim 1, wherein the wiring layer extends so as to cover a portion of the back surface.

* * * * *